(12) United States Patent
Nomura et al.

(10) Patent No.: US 10,403,771 B2
(45) Date of Patent: Sep. 3, 2019

(54) SINTERED COMPACT AND LIGHT EMITTING DEVICE

(71) Applicant: KOITO MANUFACTURING CO., LTD., Tokyo (JP)

(72) Inventors: Akihiro Nomura, Shizuoka (JP); Hidemichi Sone, Shizuoka (JP); Yuzo Maeno, Shizuoka (JP); Yukihiro Onoda, Shizuoka (JP)

(73) Assignee: KOITO MANUFACTURING CO., LTD., Minato-ku, Tokyo (JP)

( * ) Notice: Subject to any disclaimer, the term of this patent is extended or adjusted under 35 U.S.C. 154(b) by 106 days.

(21) Appl. No.: 15/637,098

(22) Filed: Jun. 29, 2017

(65) Prior Publication Data

US 2018/0006167 A1 Jan. 4, 2018

(30) Foreign Application Priority Data

Jul. 4, 2016 (JP) .................................. 2016-132803

(51) Int. Cl.
*H01J 1/62* (2006.01)
*H01L 31/0232* (2014.01)
*H01L 31/024* (2014.01)
*H01L 33/50* (2010.01)

(52) U.S. Cl.
CPC ...... *H01L 31/02322* (2013.01); *H01L 31/024* (2013.01); *H01L 33/501* (2013.01); *H01L 33/502* (2013.01); *H01L 2224/48091* (2013.01); *H01L 2924/12041* (2013.01)

(58) Field of Classification Search
None
See application file for complete search history.

(56) References Cited

U.S. PATENT DOCUMENTS

| | | | | |
|---|---|---|---|---|
| 6,155,699 | A | * 12/2000 | Miller | .................... H01L 33/46 257/95 |
| 8,344,404 | B2 | * 1/2013 | Fujita | ........................ C03C 3/19 257/79 |
| 8,502,441 | B2 | * 8/2013 | Izumi | .................... H01L 33/504 313/498 |
| 2015/0184830 | A1 | 7/2015 | Nagao et al. | |

FOREIGN PATENT DOCUMENTS

| | | |
|---|---|---|
| CN | 101167194 A | 4/2008 |
| CN | 104603530 A | 5/2015 |
| JP | 2012-221633 A | 11/2012 |
| WO | 2006/114726 A2 | 11/2006 |

OTHER PUBLICATIONS

Communication dated Dec. 14, 2018, from the State Intellectual Property Office of People's Republic of China in counterpart Application No. 201710520580.0.

* cited by examiner

*Primary Examiner* — Vip Patel
(74) *Attorney, Agent, or Firm* — Sughrue Mion, PLLC

(57) ABSTRACT

A sintered compact includes a wavelength conversion region containing a phosphor material that performs wavelength conversion of primary light and emits secondary light, and a holding region provided to be in contact with the wavelength conversion region. The wavelength conversion region and the holding region are integrated.

9 Claims, 11 Drawing Sheets

SINTERED COMPACT AND LIGHT EMITTING DEVICE

INCORPORATION BY REFERENCE

The disclosure of Japanese Patent Application No. 2016-132803 filed on Jul. 4, 2016 including the specification, drawings and abstract is incorporated herein by reference in its entirety.

BACKGROUND

1. Technical Field

The disclosure relates to a sintered compact and a light emitting device, and especially to a sintered compact and a light emitting device, which perform wavelength conversion of primary light from a light source and emit secondary light.

2. Description of Related Art

A light emitting device is used, in which a LED (light emitting diode) or a semiconductor laser is used as a light source and a wavelength conversion member containing a phosphor material performs wavelength conversion, thereby obtaining white light. In such a light emitting device, primary light such as blue light and ultraviolet light is emitted from the light source and irradiates the wavelength conversion member, and the phosphor contained in the wavelength conversion member is excited by the primary light and emits secondary light such as yellow light. Then, colors of the primary light and the secondary light are mixed and white light is emitted outside.

In Japanese Patent Application Publication No. 2012-221633 (JP 2012-221633 A), a vehicle lighting fixture is proposed, in which a semiconductor laser is used as a light source. When a semiconductor laser is used as a light source, a characteristic appears that primary light with a large output and a narrow width of wavelength is obtained, but directivity is very strong and the light irradiates a small region. Therefore, compared to a case where a LED is used as a light source, the primary light with a large output irradiates an extremely small region of a wavelength conversion member, and white light is emitted. Thus, a light emitting device having high directivity is obtained.

Meanwhile, in the wavelength conversion member of the light emitting device, heat is generated simultaneously with the wavelength conversion of the primary light. In particular, in the case where a semiconductor laser is used as a light source, the primary light intensively irradiates a small region, temperature of the wavelength conversion member increases easily. Since the phosphor contained in the wavelength conversion member has a characteristic that its temperature is associated with wavelength conversion efficiency, when a temperature change is too large, it is not possible to perform appropriate wavelength conversion, thereby causing a problem that sufficient white light is not obtained.

SUMMARY

FIG. 12A is a schematic view showing an example of a method for fixing a wavelength conversion member in a light emitting device in which a semiconductor laser serves as a light source. In the light emitting device, in which the semiconductor laser is used as the light source, a solid wavelength conversion member 2 containing a phosphor material is arranged on a surface of a light extraction part 1 that is made from sapphire or the like that transmits primary light, and the wavelength conversion member 2 is fixed to the light extraction part 1 by an adhesive 3. The semiconductor laser serving as the light source is arranged at a position away from the wavelength conversion member 2, and is not shown.

FIG. 12B is a schematic view showing another example of a method for fixing a wavelength conversion member in a light emitting device in which a semiconductor laser serves as a light source. In this example, an opening is previously formed in a light extraction part 1 of the light emitting device, and a wavelength conversion member 2 is inserted in the opening. An adhesive 3 is injected between a side surface of the wavelength conversion member 2 and an inner surface of the opening of the light extraction part 1, and the wavelength conversion member 2 is fixed to the light extraction part 1. In this example, the light extraction part 1 does not need to be a material that transmits primary light, and a ceramic material or the like may be used.

In the light emitting devices shown in FIG. 12A and FIG. 12B, since the wavelength conversion member 2 is fixed by the adhesive 3, heat generated in the wavelength conversion member 2 is transferred to the light extraction part 1 through the adhesive 3 and dissipated. In general, the light extraction part 1 is made from sapphire or ceramics, and the adhesive 3 is made from glass, silicone resin or the like, and these materials have relatively low thermal conductivity. Therefore, it is difficult to favorably dissipate heat generated in the wavelength conversion member 2.

Therefore, the disclosure provides a sintered compact and a light emitting device that are able to efficiently dissipate heat generated with wavelength conversion.

A sintered compact according to the first aspect of the disclosure includes a wavelength conversion region containing a phosphor material that performs wavelength conversion of primary light and emits secondary light, and a holding region provided to be in contact with the wavelength conversion region. The wavelength conversion region and the holding region are integrated.

In the above aspect, since the wavelength conversion region and the holding region are integrated, the holding region is able to hold the wavelength conversion region without using an adhesive, and heat generated with the wavelength conversion is dissipated efficiently.

In the foregoing aspect, the holding region may have higher thermal conductivity than that of the wavelength conversion region.

Further, in the foregoing aspect, the holding region may have a structure in which a minute second ceramic material is dispersed inside a first ceramic material, and the first ceramic material and the second ceramic material are intertwined with each other three-dimensionally.

Furthermore, in the foregoing aspect, the first ceramic material may have higher thermal conductivity than that of the wavelength conversion region.

Yet further, in the foregoing aspect, a refractive index difference between the first ceramic material and the second ceramic material may be 0.2 or larger.

A light emitting device according to the second aspect of the disclosure includes the sintered compact and a light emitting element that emits the primary light.

According to the disclosure, it is possible to provide the sintered compact and the light emitting device, which are able to efficiently dissipate heat generated with wavelength conversion.

BRIEF DESCRIPTION OF THE DRAWINGS

Features, advantages, and technical and industrial significance of exemplary embodiments of the disclosure will be described below with reference to the accompanying drawings, in which like numerals denote like elements, and wherein.

DETAILED DESCRIPTION OF EMBODIMENTS

Figure 1:
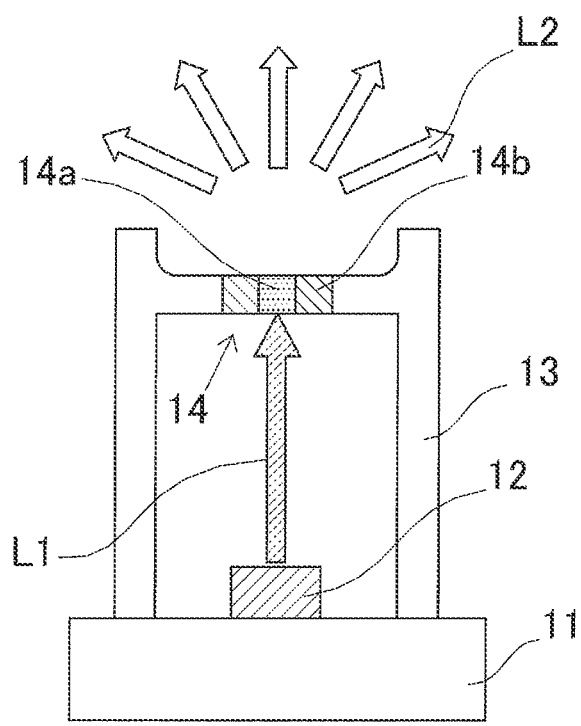
FIG. 1 is a schematic sectional view of a light emitting device 10 in an embodiment.

The first embodiment of the disclosure is explained in detail below with reference to the drawings. The same reference numerals are used for the same or equivalent components, members, processing shown in each of the drawings, and duplicated explanation is omitted as appropriate. FIG. 1 is a schematic sectional view of a light emitting device 10 in the embodiment.

The light emitting device 10 is provided with a stem 11, a semiconductor laser 12, a case part 13, and a wavelength conversion member 14. In the light emitting device 10, the semiconductor laser 12 emits primary light L1 that irradiates the wavelength conversion member 14, and the color of the primary light L1 is mixed with secondary light obtained from wavelength conversion performed by the wavelength conversion member 14, thereby allowing white light L2 to be emitted outside. FIG. 1 shows the light emitting device 10 of, but not limited to, a so-called CAN type package, and various types of packages for a semiconductor laser may be used.

The stem 11 is a member on which the semiconductor laser 12 is mounted and the case part 13 is fixed, and is provided with a lead pin, a heat sink and so on (not shown) so that electric power is supplied from outside to the semiconductor laser 12 and heat generated in the semiconductor laser 12 is transferred outside. Although a material for the stem 11 is not particularly limited, metal with good heat dissipation, such as copper, is preferred.

The semiconductor laser 12 is a semiconductor element where electric power is supplied and a laser beam is oscillated. Although a material for the semiconductor laser 12 is not particularly limited, a nitride-based semiconductor is used when blue light or ultraviolet light is irradiated as the primary light L1. Device structures of the semiconductor laser 12, such as a resonator structure, an electrode structure, and a current confinement structure, are not particularly limited either, and structures that are appropriate for getting required light emission intensity and oscillation wavelength may be used. In the embodiment, the semiconductor laser 12 is shown as an element that emits the primary light L1. However, the element is not limited to the semiconductor laser as long as it is a light emitting element that emits the primary light L1 whose wavelength is converted by the wavelength conversion member 14, and may be a light emitting diode, an organic EL, and so on.

The case part 13 is a member arranged so as to cover the semiconductor laser 12 on top of the stem 11, and is provided with a cylindrical side wall raising from the stem 11, and an upper surface. There is an opening in the center of the upper surface of the case part 13, and the wavelength conversion member 14 is fixed to the opening. Although a material for the case part 13 is not limited, a metallic material with excellent thermal conductivity is preferred in order to favorably transfer heat generated in the wavelength conversion member 14 to the stem 11.

The wavelength conversion member 14 is a sintered compact in which a wavelength conversion region 14a and a holding region 14b are in contact with each other and formed integrally. The wavelength conversion member 14 is fixed to the opening of the case part 13 and works as a part that extracts light from the light emitting device 10.

Figure 2A:
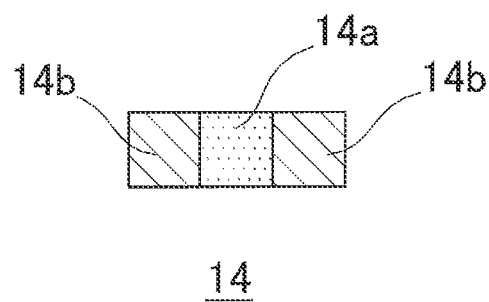
FIG. 2A is a schematic sectional view of a structure of a wavelength conversion member 14 in the first embodiment.
Figure 2B:
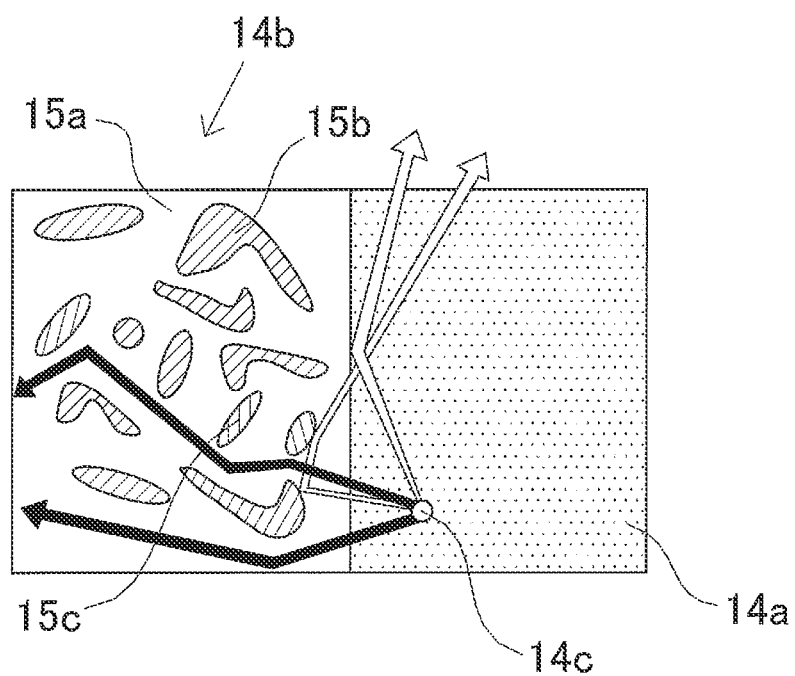
FIG. 2B is an enlarged schematic sectional view of structures of a wavelength conversion region 14a and a holding region 14b.

FIG. 2A is a schematic sectional view of a structure of the wavelength conversion member 14 in the first embodiment, and FIG. 2B is an enlarged schematic sectional view of structures of the wavelength conversion region 14a and the holding region 14b. As shown in FIG. 2A and FIG. 2B, the wavelength conversion member 14 in the embodiment is provided with the wavelength conversion region 14a and the holding region 14b.

The wavelength conversion region 14a is a part containing a phosphor material, which is excited by the primary light L1 irradiating from the semiconductor laser 12 and emits the secondary light. Then, the colors of the primary light L1 and the secondary light are mixed, thereby allowing the white light L2 to be emitted outside. Here, an example is shown in which the colors of the primary light L1 and the secondary light are mixed so that the white light L2 is emitted. However, a plurality of phosphor materials may be provided so that the secondary light in a plurality of colors are emitted, and the white light L2 may be emitted as a result of mixture of the colors of the secondary light. An example is shown in which the light L2 to be emitted is white light, but the light L2 may be other monochromatic light, or may have a color other than the white color, which is obtained by mixture of a plurality of colors.

A size of the wavelength conversion region 14a only needs to be larger than a region irradiated with the primary light L1 from the semiconductor laser 12, and allow appropriate wavelength conversion of the primary light L1 to obtain the secondary light. For example, the wavelength conversion region 14a has a thickness of around several hundreds μm, and a diameter of around 0.1~several mm. The phosphor material contained in the wavelength conversion region 14a is a ceramic phosphor because it is sintered simultaneously with the holding region 14b as described later. As a specific material, ceramic phosphor obtained by sintering a ceramic body made from $Y_3Al_5O_{12}$, or YAG (yttrium aluminum garnet) powder is most preferred. By using a YAG sintered compact as the wavelength conversion region 14a, wavelength of the primary light L1, which is blue light, is converted, thus emitting the secondary light, which is yellow light, and color mixture of the primary light and the secondary light produces white light.

The holding region 14b is a part that is formed integrally and sintered simultaneously with the wavelength conversion region 14a, and holds the wavelength conversion region 14a. A material for the holding region 14b is not particularly limited. However, in order to favorably transfer heat generated in the wavelength conversion region 14a, it is preferred that the holding region 14b has higher thermal conductivity than the wavelength conversion region 14a, and that the thermal conductivity of the holding region 14b is 20 W/mK or higher.

Also, as shown in FIG. 2B, the holding region 14b has a structure in which a second ceramic material 15b and a third ceramic material 15c are intertwined with each other three-dimensionally inside a first ceramic material 15a. The thermal conductivity of the holding region 14b means thermal conductivity of the entire ceramics having the structure in which these materials are intertwined with each other three-dimensionally.

The first ceramic material 15a is a phase that is in contact with the wavelength conversion region 14a and formed continuously throughout the entire holding region 14b, and phases of the second ceramic material 15b and the third ceramic material 15c are intertwined with each other three-dimensionally inside the first ceramic material 15a. Although a material for the first ceramic material 15a is not particularly limited, it is preferred that the first ceramic material 15a is made from a material having higher thermal conductivity than those of the second ceramic material 15b and the third ceramic material 15c. By making the first ceramic material 15a using a material having higher thermal conductivity than those of the rest of the ceramic materials, heat generated in phosphor 14c inside the wavelength conversion region 14a is easily transferred through the first ceramic material 15a and dissipated outside as shown by black arrows in FIG. 2B.

Further, it is preferred that a material for the second ceramic material 15b or the third ceramic material 15c has a refractive index difference of 0.2 or larger from the first ceramic material 15a. When the plurality of ceramic materials have large refractive index differences from each other, as shown by outlined arrows in FIG. 2B, light advancing from the wavelength conversion region 14a towards the holding region 14b is reflected by interfaces among the first ceramic material 15a to the third ceramic material 15c that are intertwined with each other three-dimensionally. This makes the holding region 14b a white region as a whole, allowing the holding region 14b to also serve as a light reflecting part that is able to prevent light leakage in a lateral direction. Also, light is caused to return towards the wavelength conversion region 14a and extracted outside from the wavelength conversion region 14a.

The holding region 14b described herein is made from the three types of materials, which are the first ceramic material 15a to the third ceramic material 15c. However, the number of types of the materials is not limited as long as the holding region 14b has a structure in which a plurality of ceramic materials are intertwined with each other three-dimensionally.

When an appropriate combination of materials as the first ceramic material 15a to the third ceramic material 15c is selected and a composition ratio and synthesizing temperature are set appropriately for sintering, the above-mentioned holding region 14b has the structure where each of the materials does not become a compound and each phase is intertwined with one another three-dimensionally. Table 1 shows combinations of thermal conductivity and the refractive index of specific ceramic materials, as well as examples of synthesizing temperature and composition ratios. As shown in Table 1, when $Al_2O_3$ is selected as the first ceramic material 15a, YSZ ($Y_2O_3$ stabilized $ZrO_2$) and $TiO_2$ (rutile type) may be used as the second ceramic material 15b and the third ceramic material 15c. Also, when MgO is selected as the first ceramic material 15a, YSZ may be used as the second ceramic material 15b.

TABLE 1

| | | The first ceramics | | | The second ceramics | | Refractive index difference between the first and second ceramics | Synthesizable temperature [° C.] | Composition ratio [mol %] |
|---|---|---|---|---|---|---|---|---|---|
| No. | Material | Heat conductivity [W/m · k] | Refractive index | Material | Heat conductivity [W/m · k] | Refractive index | | | |
| 1 | $Al_2O_3$ | About 30 | 1.76 | YSZ*[1] | About 3 | 2.1 | 0.34 | 800~1800 | $Al_2O_3$ is 8.5~88 |
| 2 | $Al_2O_3$ | ↑ | ↑ | TiO2 (Rutile) | About 8 | 2.7 | 0.96 | 800~1200 | $Al_2O_3$ is 7.5~87 |
| 3 | MgO | About 60 | 1.7 | YSZ | About 3 | 2.1 | 0.4 | 800~2100 | MgO is 22.4~94.6 |

*[1]Y2O3stabilizedZrO2

Figure 3A:
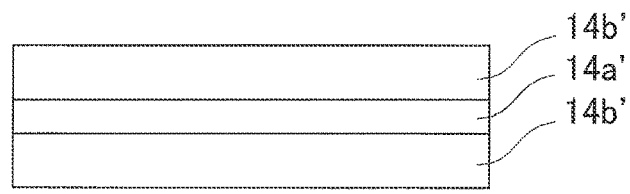
FIG. 3A is a process view of a manufacturing method for the wavelength conversion member 14.

Next, a manufacturing method for the wavelength conversion member 14 is explained by using FIG. 3A~FIG. 3D. First, as shown in FIG. 3A, a green sheet 14a', in which raw materials for the wavelength conversion region 14a are mixed, and a green sheet 14b', in which raw materials for the holding region 14b are mixed, are prepared. Then, a layered green sheet is made, in which the green sheet 14a' is sandwiched between the green sheets 14b'. For example, the green sheet 14a' containing YAG phosphor is used, and a composite material containing the plurality of ceramic materials shown in Table 1 is used as the green sheet 14b'.

Figure 3B:
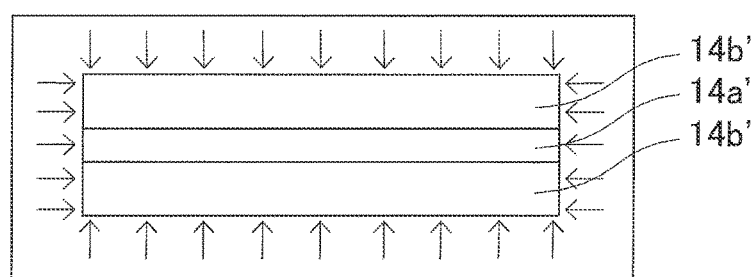
FIG. 3B is a process view of the manufacturing method for the wavelength conversion member 14.

Next, as shown in FIG. 3B, the layered green sheets obtained are pressed by using a warm isostatic pressing (WIP) device, and the green sheet 14a' and the green sheets 14b' are adhered to one another.

Figure 3C:
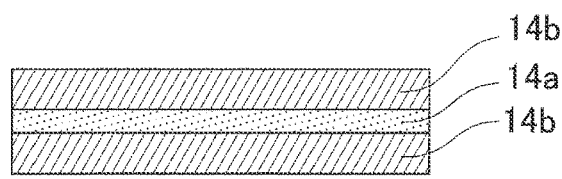
FIG. 3C is a process view of the manufacturing method for the wavelength conversion member 14.
Figure 3D:
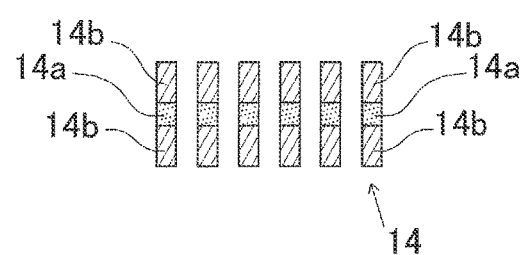
FIG. 3D is a process view of the manufacturing method for the wavelength conversion member 14.

Next, as shown in FIG. 3C, the adhered layered green sheets are sintered simultaneously, and a sintered compact is obtained, which has a layer structure where the wavelength conversion region 14a is sandwiched between the holding regions 14b. When YAG is used as the phosphor material contained in the wavelength conversion region 14a, the combination No. 1 or No. 3 in Table 1 is selected as the materials for the holding region 14b, and the sintering temperature is set to 1500~1600 C°.

Finally, the sintered compact having the obtained layer structure is divided by dicing, etc., thereby obtaining the wavelength conversion member 14 that is a sintered compact in which the holding regions 14b are in contact with both sides of the wavelength conversion region 14a and sintered integrally.

Figure 4:
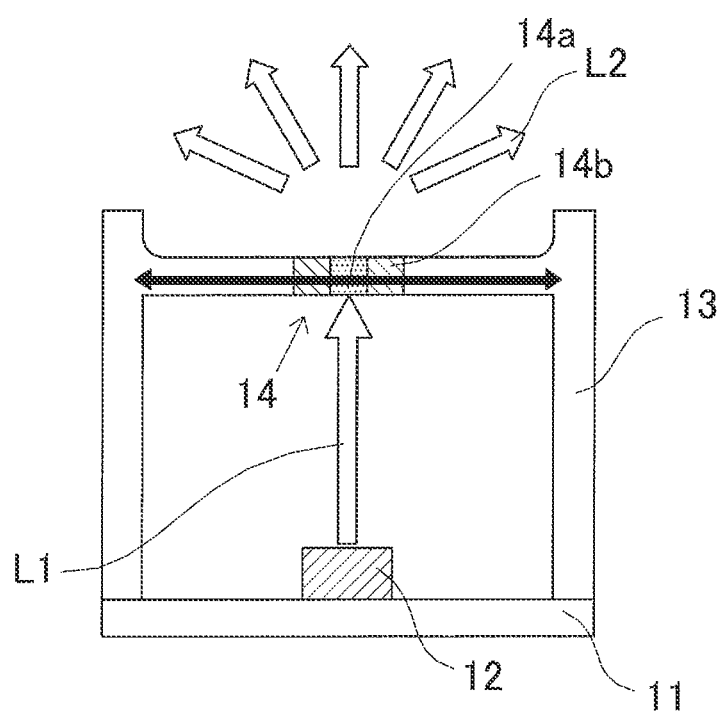
FIG. 4 is a conceptual view of how heat is transferred in the light emitting device 10 in the first embodiment.

FIG. 4 is a conceptual view of how heat is transferred in the light emitting device 10 of the embodiment. The wavelength conversion member 14 of the light emitting device 10 is irradiated by the primary light L1 emitting from the semiconductor laser 12. A black arrow in FIG. 4 schematically shows a path of heat from the wavelength conversion region 14a. As stated earlier, since the holding region 14b has higher thermal conductivity than that of the wavelength conversion region 14a, heat is transferred favorably to the case part 13 through the holding regions 14b that are in contact with side surfaces of the wavelength conversion region 14a, respectively, and sintered simultaneously, and then heat is dissipated. Further, as described above, since a plurality of ceramic materials having the refractive index differences of 0.2 or larger from each other are intertwined with one another three-dimensionally in the holding region 14b, light advancing from the wavelength conversion region 14a towards the holding region 14b is reflected without being transmitted through the holding region 14b, and taken out from the wavelength conversion region 14a as shown by arrows L2 in the drawing.

As stated above, in this embodiment, the wavelength conversion member 14 has the wavelength conversion region 14a, which contains the phosphor material that performs wavelength conversion of the primary light and emits the secondary light, and the holding region 14b, which is provided to be in contact with the wavelength conversion region 14a. Also, the wavelength conversion member 14 is the sintered compact in which the wavelength conversion region 14a and the holding region 14b are sintered simultaneously and integrally. Thus, the sintered compact in this embodiment is able to efficiently dissipate heat generated with wavelength conversion.

Figure 5A:
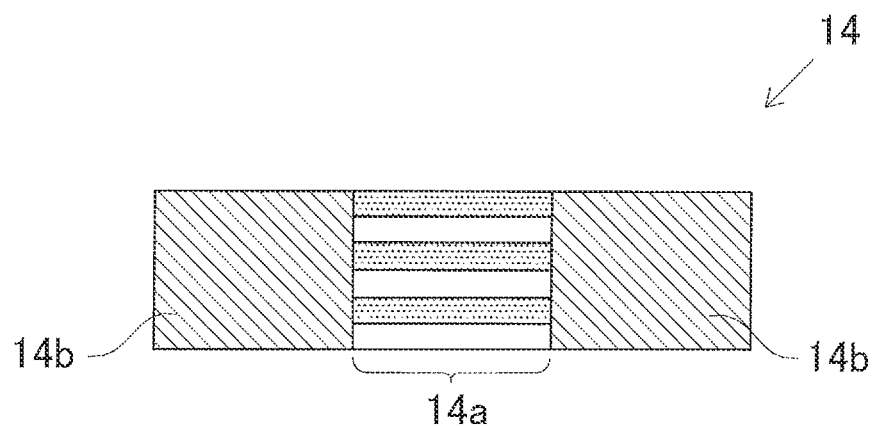
FIG. 5A is a schematic sectional view of a structure of a wavelength conversion member 14 in a modification of the first embodiment.
Figure 5B:
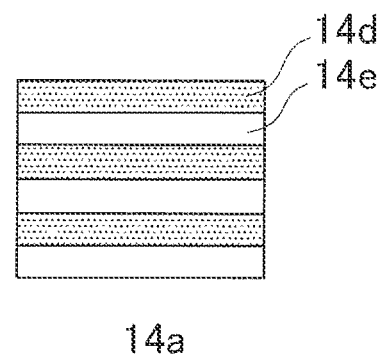
FIG. 5B is a schematic sectional view of a wavelength conversion region 14a that is enlarged so that details are shown.

Next, a modification of the first embodiment is explained with reference to FIG. 5A and FIG. 5B. FIG. 5A is a schematic sectional view of a structure of a wavelength conversion member 14 in the modification of the first embodiment, and FIG. 5B is a schematic sectional view of a wavelength conversion region 14a that is enlarged so that details are shown. In this modification, the wavelength conversion region 14a of the wavelength conversion member 14 has a layer structure having wavelength conversion layers 14d and heat transport layers 14e.

The wavelength conversion layer 14d is a layer containing a phosphor material that is excited by primary light L1 emitted from a semiconductor laser 12, and emits secondary light. Specific materials for the wavelength conversion layer 14d are similar to those stated in the foregoing first embodiment.

The heat transport layer 14e is a layer made from a transparent material that transmits the primary light L1 and the secondary light. The transparent heat transport layer 14e means that the heat transport layer 14e has high total light transmittance. Linear transmittance may be low, and it is preferred that the total light transmittance is 80% or higher, for example. It is also preferred that a material used for the heat transport layer 14e has higher thermal conductivity than that of the wavelength conversion layer 14d.

As shown in FIG. 5A and FIG. 5B, the wavelength conversion region 14a has a structure in which the wavelength conversion layer 14d and the heat transport layer 14e are layered alternately. Because of this, heat generated in the wavelength conversion layers 14d is transferred favorably to the holding region 14b through the heat transport layers 14e, and heat generated with wavelength conversion is dissipated efficiently. Further, since the heat transport layer 14e has high total light transmittance and is transparent, the heat transport layer 14e does not block the primary light L1 from the semiconductor laser 12 and the secondary light obtained after wavelength conversion in the wavelength conversion layer 14d, thereby achieving both emission of the primary light L1 and extraction of the secondary light, and heat dissipation.

In FIG. 5A and FIG. 5B, an example is shown in which three wavelength conversion layers 14d and three heat transport layers 14e are layered alternately. However, the number of the layers is not limited, and the number may be larger or one each. Thicknesses of the wavelength conversion layer 14d and the heat transport layer 14e may be similar or different, and a ratio of the thicknesses may be set as appropriate depending on a balance between wavelength conversion in the wavelength conversion layer 14d and heat transportation in the heat transport layer 14e.

The wavelength conversion layer 14d and the heat transport layer 14e may be laminated to each other alternately by using an adhesive such as silicone resin, or green sheets may be bonded together and sintered integrally. By using the warm isostatic press and the sintering technology described in the first embodiment, the holding region 14b, the wavelength conversion layer 14d, and the heat transport layer 14e are sintered simultaneously. Then, reflection at an interface between the layers is reduced, and efficiency in extraction of the primary light L1 and the secondary light is improved. Thus, it is preferred that integral sintering is used to form the wavelength conversion member 14. As examples of specific materials for the wavelength conversion layer 14d and the heat transport layer 14e, which are sintered integrally, when YAG is used for the wavelength conversion layer 14d, alumina may be combined as the heat transport layer 14e.

In the modification of the embodiment, the wavelength conversion region 14a has the layered structure of the wavelength conversion layers 14d and the heat transport layers 14e, and the heat transport layers 14e are able to favorably transport heat generated in the wavelength conversion layers 14d due to wavelength conversion to the holding region 14b. As a result, heat dissipation is improved, making it possible to prevent deterioration of wavelength conversion efficiency caused by an excessive temperature increase in the wavelength conversion layers 14d.

Figure 6:
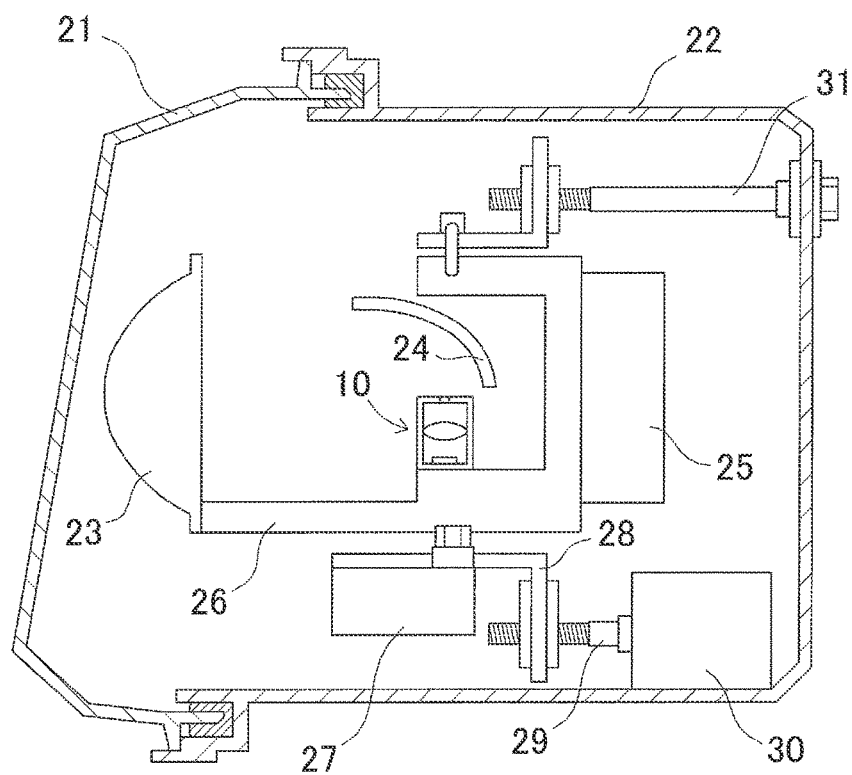
FIG. 6 is a schematic sectional view of a lighting fixture unit 20 in the second embodiment.

Next the second embodiment of the disclosure is explained with reference to FIG. 6. Explanation of parts duplicated with the first embodiment is omitted. FIG. 6 is a schematic sectional view of a lighting fixture unit 20 in the second embodiment. This embodiment is a lighting fixture unit for a vehicle, which is configured by using the light emitting device 10 described in the first embodiment as a light source.

The lighting fixture unit 20 shown in FIG. 6 is configured so as to form a light distribution pattern for high beam. The lighting fixture unit 20 is provided with the light emitting device 10, a cover 21, a lamp body 22, a projection lens 23, a reflector 24 having an elliptic reflecting surface that reflects emitted light towards the projection lens 23, a heat dissipation fin 25 that dissipates heat generated in the light emitting device 10 outside through a base part 26, the base part 26 on which the light emitting device 10 is mounted, a swivel actuator 27, a screw 29, a leveling actuator 30, and a screw 31.

The base part 26 is supported by the swivel actuator 27 so as to be able to swivel in a horizontal direction. An upper part of the base part 26 is connected with the lamp body 22 through the screw 31 and so on. The swivel actuator 27 is connected with the leveling actuator 30. The leveling actuator 30 moves a connecting member 28 by rotating the screw 29, and is able to change inclination of the base part 26 in an upper-lower direction. Thus, the leveling actuator 30 is used for changing an optical axis of the lighting fixture unit 20 and a light distribution pattern formed by the lighting fixture unit 20 in the upper-lower direction.

As shown in FIG. 1, wavelength of the primary light L1 emitted from the semiconductor laser 12 is converted by the wavelength conversion member 14 into the secondary light, and the white light L2 made by color mixture of the primary light L1 and the secondary light is emitted from the light emitting device 10. As shown in FIG. 6, the white light emitted from the light emitting device 10 upwardly is reflected by the reflector 24 to the front, transmitted through the projection lens 23 and the cover 21, and projected in front of the vehicle.

In the lighting fixture unit 20 in this embodiment, as shown in FIG. 4 and FIG. 6, heat generated in the wavelength conversion region 14a goes through the case part 13 and the stem 11 through the holding region 14b, is transferred to the heat dissipation fin 25 from the base part 26, and then dissipated. Therefore, in the lighting fixture unit 20 in the embodiment, it is also possible to realize stable white light irradiation while favorably dissipating heat generated in the wavelength conversion region 14a.

Figure 7:
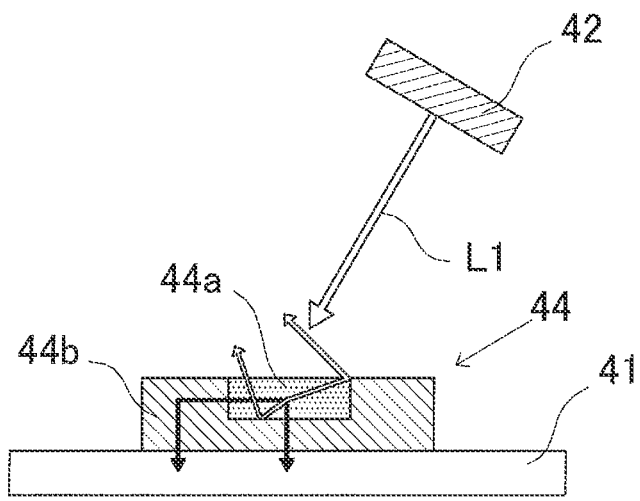
FIG. 7 is a schematic sectional view of a light emitting device 40 in the third embodiment.

Next, the third embodiment of the disclosure is explained with reference to FIG. 7. Explanation of parts duplicated with the first embodiment is omitted. FIG. 7 is a schematic sectional view of a light emitting device 40 in the third embodiment. The light emitting device 40 is provided with a stem 41, a semiconductor laser 42, and a wavelength conversion member 44. In the light emitting device 40, primary light L1 is emitted from the semiconductor laser 42 and irradiates the wavelength conversion member 44. Then, a color of the primary light L1 is mixed with that of secondary light, which is obtained after wavelength conversion in the wavelength conversion member 44. Thus, the light emitting device 40 emits white light outside.

In this embodiment, the wavelength conversion member 44 is a sintered compact in which a wavelength conversion region 44a and a holding region 44b are in contact with one another and formed integrally. In the wavelength conversion member 44 in this embodiment, the holding region 44b is in contact with side surfaces and a bottom surface of the wavelength conversion region 44a, forming a shape in which the wavelength conversion region 44a is buried in the holding region 44b. Further, the holding region 44b has a structure in which a plurality of ceramic materials are intertwined with each other three-dimensionally. By making the refractive index difference between the ceramic materials 0.2 or larger, the holding region 14b becomes a white region as a whole, and also works as a light reflecting part.

The semiconductor laser 42 is arranged on an exposed surface side of the wavelength conversion region 44a, and emits the primary light L1 towards the wavelength conversion region 44a. The primary light L1 incident on the wavelength conversion region 44a is extracted outside from the exposed surface after the wavelength is converted by a phosphor material. As shown by an outlined arrow in FIG. 7, light advancing from the wavelength conversion region 44a to the holding region 44b is reflected by the holding region 44b that serves as the light reflecting part, caused to return towards the wavelength conversion region 44a, and extracted outside.

As shown by a black arrow in FIG. 7, since the holding region 44b has higher thermal conductivity than that of the wavelength conversion region 44a, heat is favorably transferred and dissipated through the holding region 44b and the stem 41. The holding region 44b is obtained by being in contact with the side surfaces and the bottom surface of the wavelength conversion region 44a and sintered simultaneously.

Figure 8:
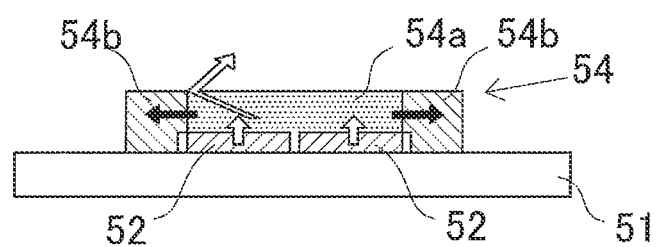
FIG. 8 is a schematic sectional view of a light emitting device 50 in the fourth embodiment.

Next, the fourth embodiment of the disclosure is explained with reference to FIG. 8. Explanation of parts duplicated with the first embodiment is omitted. FIG. 8 is a schematic sectional view of a light emitting device 50 in the fourth embodiment. The light emitting device 50 is provided with a stem 51, semiconductor lasers 52, and a wavelength conversion member 54. In the light emitting device 50, primary light L1 from the semiconductor lasers 52 irradiates the wavelength conversion member 54, and the color of the primary light L1 is mixed with that of secondary light, which is obtained after wavelength conversion at the wavelength conversion member 54. Thus, the light emitting device 50 emits white light L2 outside.

In this embodiment, the wavelength conversion member 54 is also a sintered compact in which a wavelength conversion region 54a and a holding region 54b are in contact with each other and formed integrally. In the wavelength conversion member 54 in this embodiment, the holding region 54b is in contact with side surfaces of the wavelength conversion region 54a. Further, the holding region 54b has a structure in which a plurality of ceramic materials are intertwined with each other three-dimensionally. By making the refractive index difference among the ceramic materials 0.2 or larger, the holding region 54b becomes a white region as a whole, and also works as a light reflecting part.

In this embodiment, the semiconductor lasers 52 are mounted on the stem 51, the wavelength conversion member 54 is arranged on top of the semiconductor lasers 52, and wavelength conversion region 54a covers light emitting positions of the semiconductor lasers 52. Wavelength of the primary light L1 incident on the wavelength conversion region 54a is converted by the phosphor material, and the light is extracted outside from an exposed surface. As shown by an outlined arrow in FIG. 8, light directed from the wavelength conversion region 54a towards the holding region 54b is reflected by the holding region 54b that serves as the light reflecting part, caused to return towards the wavelength conversion region 54a, and extracted outside.

As shown by black arrows in FIG. 8, since the holding region 54b has higher thermal conductivity than that of the wavelength conversion region 54a, heat is favorably transferred through the holding region 54b and dissipated. The holding region 54b is in contact with the side surfaces of the wavelength conversion region 54a and sintered integrally.

Figure 9:
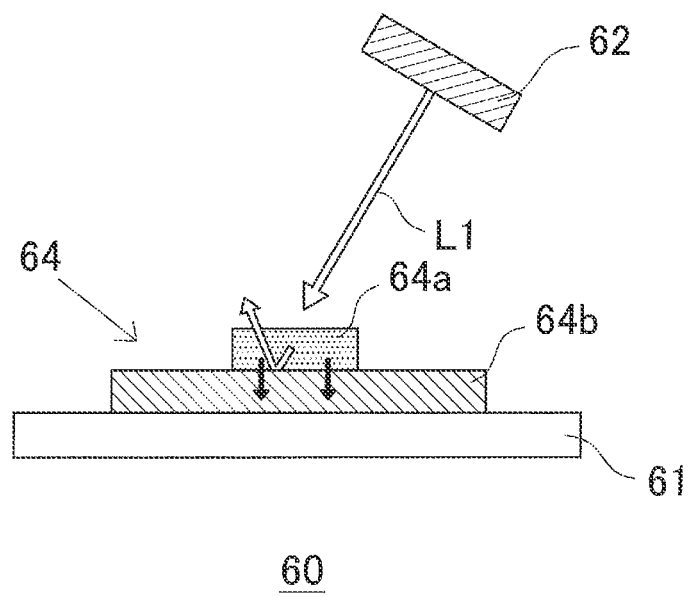
FIG. 9 is a schematic sectional view of a light emitting device 60 in the fifth embodiment.

Next, the fifth embodiment of the disclosure is explained with reference to FIG. 9. Explanation of parts duplicated with the first embodiment is omitted. FIG. 9 is a schematic sectional view of a light emitting device 60 in the fifth embodiment. The light emitting device 60 is provided with a stem 61, a semiconductor laser 62, and a wavelength conversion member 64. In the light emitting device 60, primary light L1 from the semiconductor laser 62 irradiates the wavelength conversion member 64, and the color of the primary light L1 is mixed with that of secondary light emitted after wavelength conversion at the wavelength conversion member 64. Thus, light emitting device 60 emits white light L2 outside.

In this embodiment, the wavelength conversion member 64 is also a sintered compact in which a wavelength conversion region 64a and a holding region 64b are in contact with one another and formed integrally. In the wavelength conversion member 64 in this embodiment, the holding region 64b is in contact with a bottom surface of the wavelength conversion region 64a, and the wavelength conversion region 64a is mounted on an upper surface of the holding region 64b. Further, the holding region 64b has a structure in which a plurality of ceramic materials are intertwined with each other three-dimensionally. By making the refractive index difference among the ceramic materials 0.2 or larger, the holding region 64b becomes a white region as a whole, and also serves as a light reflecting part.

The semiconductor laser 62 is arranged on an exposed surface side of the wavelength conversion region 64a, and emits the primary light L1 towards the wavelength conversion region 64a. The primary light L1 incident on the wavelength conversion region 64a is extracted outside from the exposed surface after going through wavelength conversion performed by a phosphor material. As shown by an outlined arrow in FIG. 9, light directed from the wavelength conversion region 64a to the holding region 64b is reflected by the holding region 64b that serves as the light reflecting part, caused to return towards the wavelength conversion region 64a, and extracted outside.

As shown by black arrows in FIG. 9, since the holding region 64b has higher thermal conductivity than that of the wavelength conversion region 64a, heat is favorably transferred and dissipated through the holding region 64b and the stem 61. The holding region 64b is in contact with the bottom surface of the wavelength conversion region 64a and sintered simultaneously.

Figure 10A:
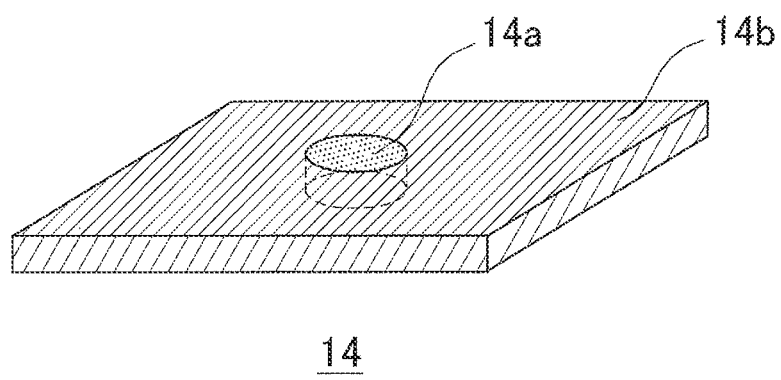
FIG. 10A is a schematic sectional view of a configuration example of a wavelength conversion member 14 in the sixth embodiment.
Figure 10B:
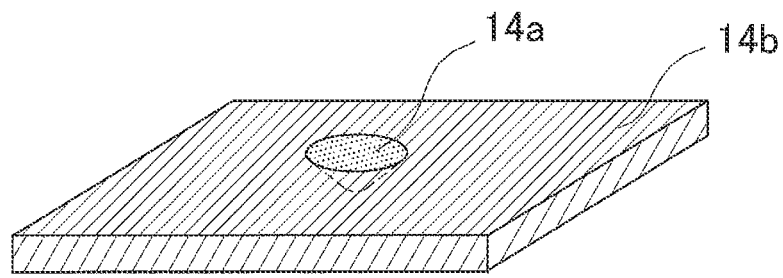
FIG. 10B is a schematic sectional view of a configuration example of the wavelength conversion member 14 in the sixth embodiment.

Next, the sixth embodiment of the disclosure is explained with reference to FIG. 10A and FIG. 10B. Explanation of parts duplicated with the first embodiment is omitted. FIG. 10A and FIG. 10B are schematic sectional views of configuration examples of a wavelength conversion member in the sixth embodiment. The wavelength conversion member, which is a sintered compact according to the disclosure, only needs to have a wavelength conversion region 14a and a holding region 14b that are in contact with each other and sintered integrally. The shapes of the wavelength conversion region 14a and the holding region 14b are not limited to those described in the first to fifth embodiments.

For example, as shown in FIG. 10A, the wavelength conversion region 14a having generally cylindrical shape may be provided near the center of the flat plate-shaped holding region 14b, and, as shown in FIG. 10B, a truncated cone-shaped wavelength conversion region 14a may be provided.

In this embodiment, the wavelength conversion member 14 has the wavelength conversion region 14a, which contains a phosphor material that performs wavelength conversion of primary light and emits secondary light, and the holding region 14b that is provided to be in contact with the wavelength conversion region 14a, and the wavelength conversion member 14 is also a sintered compact in which the wavelength conversion region 14a and the holding region 14b are sintered simultaneously and integrally, and is able to dissipate heat generated with the wavelength conversion efficiently.

Figure 11:
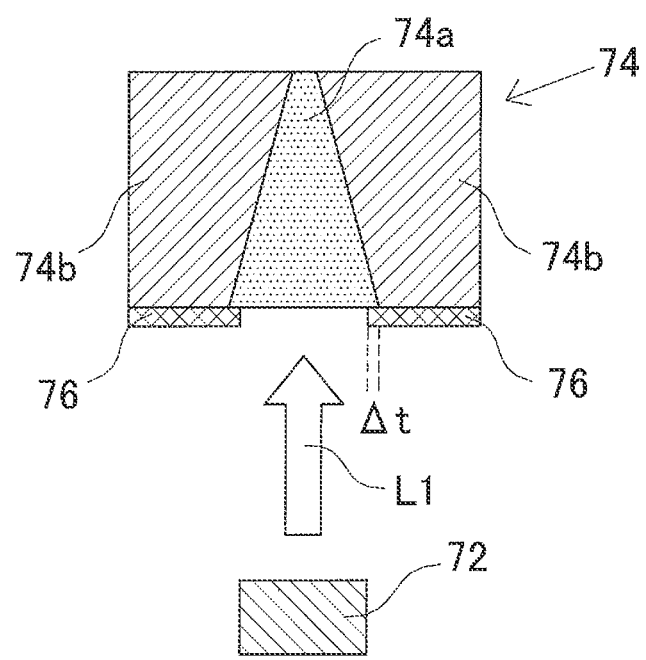
FIG. 11 is a schematic sectional view of a light emitting device 70 in the seventh embodiment.
Figure 12A:
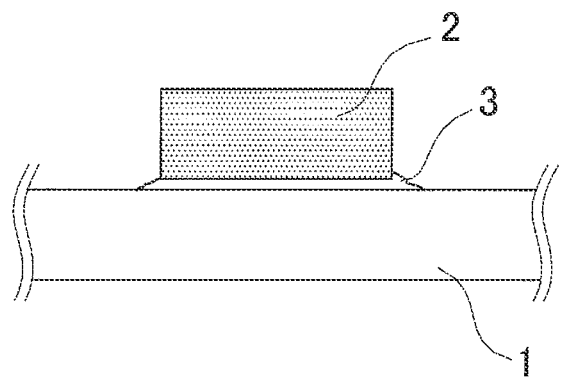
FIG. 12A is a schematic view of an example of a method for fixing a wavelength conversion member in a light emitting device according to a related art in which a semiconductor laser serves as a light source.
Figure 12B:
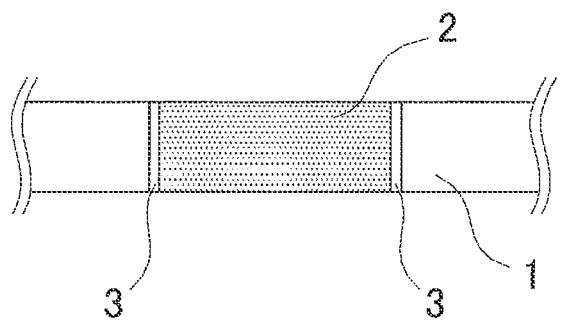
FIG. 12B is a schematic view of an example of a method for fixing a wavelength conversion member in a light emitting device according to a related art in which a semiconductor laser serves as a light source.

Next, the seventh embodiment of the disclosure is explained with reference to FIG. 11. Explanation of parts duplicated with the first embodiment is omitted. FIG. 11 is a schematic sectional view of a light emitting device 70 in the seventh embodiment.

The light emitting device 70 is provided with a semiconductor laser 72, a wavelength conversion member 74, and a holder member 76. In the light emitting device 70, primary light L1 from the semiconductor laser 72 irradiates the wavelength conversion member 74, and the color of the primary light L1 is mixed with that of secondary light emitted after wavelength conversion at the wavelength conversion member 74. Thus, the light emitting device 70 emits white light L2 outside.

As shown in FIG. 11, the wavelength conversion member 74 in this embodiment is a sintered compact in which a wavelength conversion region 74a has a generally truncated cone shape, and a side surface of the wavelength conversion region 74a is in contact with a holding region 74b and formed integrally. Also, a bottom surface of the wavelength conversion region 74a, which has the larger diameter, is an incident surface for the primary light L1, and the wavelength conversion region 74a is held so as to be tapered along an advancing direction of the primary light L1. Since the side of the wavelength conversion region 74a with the smaller diameter serves as a light emitting surface, it is possible to reduce a white light emitting area. In the shape shown here, the diameter of the wavelength conversion region 74a is reduced gradually. However, the diameter may change in steps.

The holder member 76 is a plate-shaped member in which an opening is formed, and arranged on the light incident surface side of the wavelength conversion member 74 so that the wavelength conversion region 74a is exposed on the opening. The opening of the holder member 76 is formed so that its radius is smaller than that of the light incident surface of the wavelength conversion region 74a by Δt, and arranged so as to become concentric with the wavelength conversion region 74a. A material for the holder member 76 is not limited as long as the holder member 76 has rigidity to be able to hold the wavelength conversion member 74. However, use of a ceramic material and metal having high thermal conductivity is preferred in order to improve heat dissipation.

Desired optical characteristics may be added to the opening of the holder member 76 by forming an optical film (not shown). For example, when a reflection film that transmits the primary light and reflects the secondary light is formed, it is possible to prevent the secondary light from being extracted from the incident surface side of the wavelength conversion region 74a. Thus, it becomes possible to extract white light from the emitting surface side efficiently and restrain a decrease in luminous flux and brightness.

In this embodiment, concentration of a phosphor material contained in the wavelength conversion region 74a is low, and the thickness of wavelength conversion region 74a is increased compared to those in the related art. For example, in the related art, a phosphor concentration is in a range of 0.05~0.5 atm %, and the thickness is about 0.1~0.3 mm. However, in this embodiment, the phosphor concentration is within a range of 0.0005~0.05 atm % and the thickness is about 1~5 mm.

Since the concentration of the phosphor contained in the wavelength conversion region 74a is low, positions where heat is generated due to wavelength conversion from the primary light to the secondary light are dispersed. Because the thickness of the wavelength conversion region 74a is large, an area in contact with the holding region 74b becomes large. Due to the dispersion of heat generation positions and an increase in the contact area, heat dissipation efficiency from the wavelength conversion region 74a is improved. Further, by increasing the diameter of the light incident surface side of the wavelength conversion region 74a, it is possible to improve wavelength conversion and heat dissipation simultaneously on the incident surface side where light intensity of the primary light is high. In this case, the primary light advances in the wavelength conversion region 74a and wavelength conversion of the primary light is performed in the phosphor. Therefore, even if the diameter on the emitting surface side is reduced, wavelength conversion of the primary light is performed efficiently. Also, by reducing the diameter of the emitting surface, brightness is improved.

In this embodiment, the side of the wavelength conversion region 74a with the larger diameter serves as the incident surface, but the side with the smaller diameter may be the incident surface. In this case, the diameter expands along an advancing direction of the primary light, and, on the side surface of the wavelength conversion region 74a in contact with the holding region 74b, light is reflected towards the emitting surface having the larger diameter, and white light is extracted efficiently.

In this embodiment, the wavelength conversion member 74 also has the wavelength conversion region 74a, which contains the phosphor material that performs wavelength conversion of the primary light and emits the secondary light, and the holding region 74b, which is provided to be in contact with the wavelength conversion region 74a, and is a sintered compact in which the wavelength conversion region 74a and the holding region 74b are sintered simultaneously and integrally. Thus, the wavelength conversion member 74 is able to efficiently dissipate heat generated with wavelength conversion.

Next, a modification of the seventh embodiment is explained. As a wavelength conversion member 74, instead of a sintered compact in which a wavelength conversion region 74a and a holding region 74b are in contact with each other and formed integrally, a structure may be employed in which the wavelength conversion region 74a and the holding region 74b are sintered separately and then combined with each other, and the holder member 76 prevents the wavelength conversion region 74a from falling.

In the modification of the embodiment, since the wavelength conversion region 74a and the holding region 74b are formed as separate bodies and combined together, freedom in the shapes of the wavelength conversion region 74a and the holding region 74b is improved. Because a holder member 76, which has an opening smaller than the wavelength conversion region 74a, is arranged on the side of the wavelength conversion region 74a with the larger diameter, it is possible to prevent the wavelength conversion region 74a from falling from the holding region 74b.

The disclosure is not limited to the foregoing embodiments, and various changes may be made within the scope of claims. The technical scope of the disclosure also includes embodiments that are obtained by appropriately combining technical means disclosed in the respective embodiments.

What is claimed is:

1. A sintered compact comprising:
   a wavelength conversion region containing a phosphor material that performs wavelength conversion of primary light and emits secondary light; and
   a holding region provided to be in contact with the wavelength conversion region, wherein
   the wavelength conversion region and the holding region are integrated.

2. The sintered compact according to claim 1, wherein the holding region has higher thermal conductivity than that of the wavelength conversion region.

3. The sintered compact according to claim 1, wherein the holding region has a structure in which a second ceramic material is dispersed inside a first ceramic material and the first ceramic material and the second ceramic material are intertwined with each other three-dimensionally.

4. The sintered compact according to claim 3, wherein the first ceramic material has higher thermal conductivity than that of the wavelength conversion region.

5. The sintered compact according to claim 3, wherein a refractive index difference between the first ceramic material and the second ceramic material is 0.2 or larger.

6. A light emitting device comprising:
   the sintered compact according to claim 1; and
   a light emitting element that emits the primary light.

7. A sintered compact comprising:
   a wavelength conversion region composed of a ceramic phosphor material that performs wavelength conversion of primary light and emits secondary light; and
   a ceramic holding region provided to be in contact with the wavelength conversion region, wherein
   the wavelength conversion region and the ceramic holding region are interbonded by sintering.

8. The sintered compact according to claim 7, wherein the ceramic holding region has a higher thermal conductivity than that of the wavelength conversion region.

9. The sintered compact according to claim 7, wherein the ceramic holding region has a structure in which a second ceramic material is dispersed inside a first ceramic material, and the first ceramic material and the second ceramic material are intertwined with each other three-dimensionally.

* * * * *